US012584949B1

(12) United States Patent
Lange et al.

(10) Patent No.: US 12,584,949 B1
(45) Date of Patent: Mar. 24, 2026

(54) APPLIANCE ENERGY ESTIMATION BASED ON VOLTAGE SENSING

(71) Applicant: Amazon Technologies, Inc., Seattle, WA (US)

(72) Inventors: Henning Lange, Seattle, WA (US); Krzysztof Marcin Walczak, Sammamish, WA (US); Naveen Ramakrishnan, Redmond, WA (US); Gareth James Selfe, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 197 days.

(21) Appl. No.: 18/612,844

(22) Filed: Mar. 21, 2024

(51) Int. Cl.
*G01R 27/08* (2006.01)
*G01R 19/10* (2006.01)

(52) U.S. Cl.
CPC ............. *G01R 27/08* (2013.01); *G01R 19/10* (2013.01)

(58) Field of Classification Search
CPC ........ G01R 27/00; G01R 27/02; G01R 27/08; G01R 19/00; G01R 19/10
USPC ................................. 324/600, 649, 691, 713
See application file for complete search history.

(56) References Cited

U.S. PATENT DOCUMENTS

| | | | | |
|---|---|---|---|---|
| 8,898,026 | B2 * | 11/2014 | Howell | G01R 21/133 |
| | | | | 315/131 |
| 9,366,702 | B2 * | 6/2016 | Steele | H02J 4/00 |
| 2013/0132423 | A1 * | 5/2013 | Tsao | G06F 17/18 |
| | | | | 707/769 |
| 2015/0057825 | A1 * | 2/2015 | Steele | H02J 4/00 |
| | | | | 700/297 |

FOREIGN PATENT DOCUMENTS

| | | | | |
|---|---|---|---|---|
| CA | 3137552 A1 * | 10/2020 | | H02H 3/167 |
| CA | 3172287 A1 * | 1/2022 | | H02H 1/0015 |
| CN | 105242131 A * | 1/2016 | | G01R 31/00 |
| CN | 219695316 U * | 9/2023 | | G01R 31/00 |
| JP | 2012237573 A * | 12/2012 | | G01R 27/16 |
| JP | 2019154133 A * | 9/2019 | | H02J 3/00 |
| WO | WO-2015190434 A1 * | 12/2015 | | H02J 13/00034 |

* cited by examiner

*Primary Examiner* — Hoai-An D. Nguyen
(74) *Attorney, Agent, or Firm* — Athorus, PLLC

(57) ABSTRACT

Described are systems, methods, and apparatus that determine appliance energy usage based on voltage signals sensed at a standard electrical outlet anywhere in an electrical circuit of a location, such as a home or residence, without the need of current measurement of the electrical circuit. Voltage measurements at the electrical outlet may be used to determine a resistance of a line wire of a service drop to a service panel of the location from a transformer that provides power to the location. Likewise, voltage measurements at the electrical outlet may be used to determine a voltage into the service panel. The voltage into the service panel and the resistance at the line wire can be used to determine a current of an appliance operating the location.

20 Claims, 11 Drawing Sheets

APPLIANCE ENERGY ESTIMATION BASED ON VOLTAGE SENSING

BACKGROUND

There are two basic approaches to appliance monitoring, such as in-home appliance monitoring: intrusive monitoring and non-intrusive monitoring. In the intrusive case, current sensors are placed into the mains connection of appliances. Although this approach results in high accuracy of appliance state detection, it is not cost effective and not every appliance can be easily instrumented with a current sensor. Non-intrusive monitoring relies on single-point measurements and typically uses low frequency current and voltage measurements. However, measurements from existing systems typically require new instrumentation that must be installed into the electrical circuit at the location by an electrician.

BRIEF DESCRIPTION OF DRAWINGS

The detailed description is described with reference to the accompanying figures.

DETAILED DESCRIPTION

Figure 1:
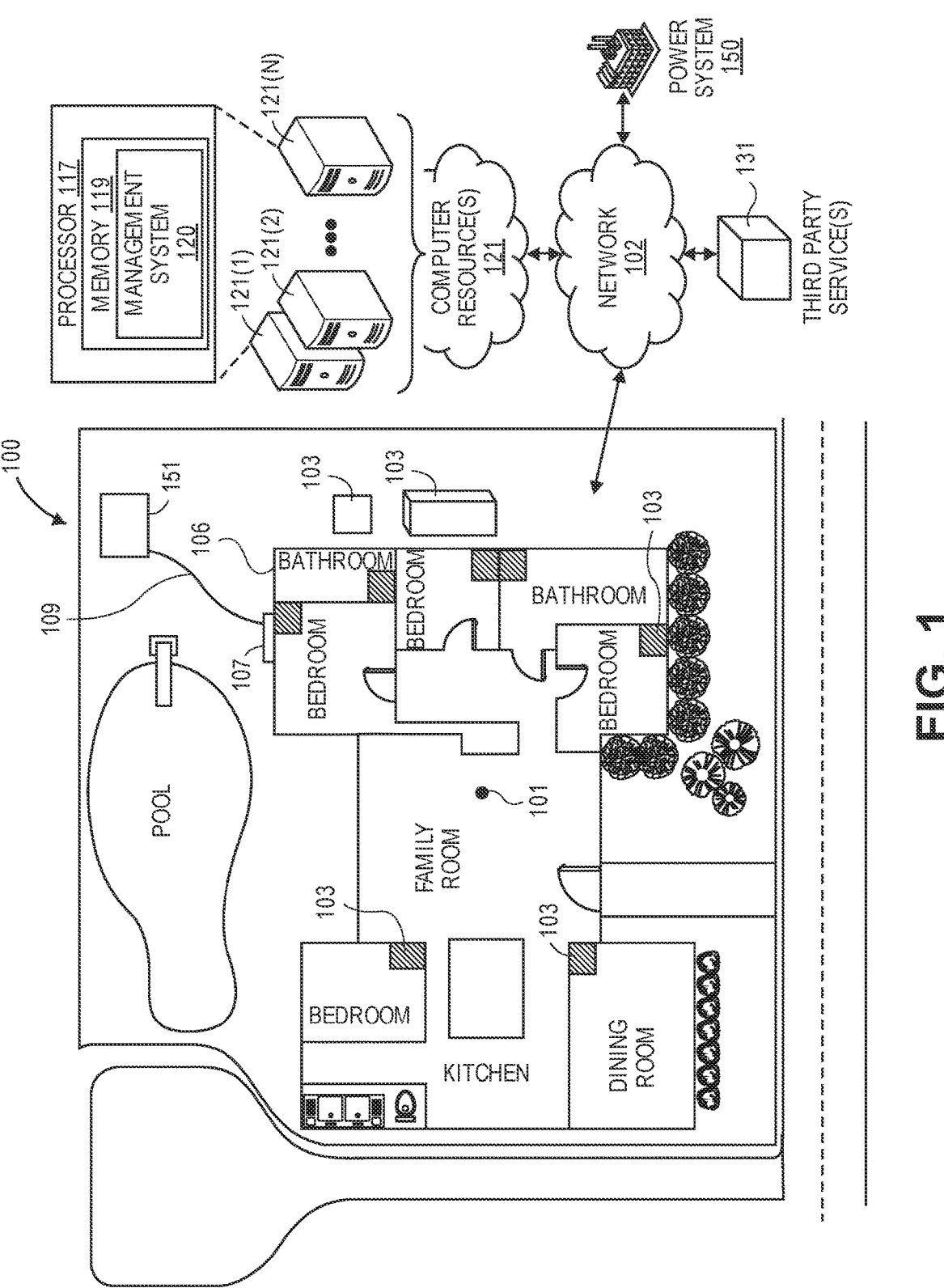
FIG. 1 is a block diagram of a location for which energy consumption is to be monitored and appliance operations determined, in accordance with disclosed implementations.

Described are systems, methods, and apparatus that determine appliance energy usage based on voltage signals sensed at a standard electrical outlet anywhere in an electrical circuit of a location, such as a home or residence, without the need of current measurement of the electrical circuit. As discussed further below, a plug-in sensor may be plugged into any common electrical outlet within the location and appliance energy estimation of appliances operating within the location, such as 240 volt ("240V") appliances, can be determined.

In some implementations, appliance current is estimated based on the voltage drop the appliance creates on the resistance of the service drop, also known as a service wire, between the service panel of the location and a transformer that provides power to the location, such as a split-phase transformer. The appliance current estimate and the voltage measurement may be used to calculate appliance energy usage of an appliance operating at the location.

As discussed further herein, with the disclosed implementations, the plug-in sensor, plugged into an electrical outlet of an electrical circuit at the location, can measure voltage at the electrical outlet and the measured voltage may be transformed into input voltage at the service panel of the location. The input voltage may then be used to estimate the voltage drop on the resistance of the line wire between the service panel of the location and the transformer that provides power to the location. Still further, the resistance on the line wire of the service drop may be estimated by actuating a switchable load that may be applied to the electrical circuit of the location by the plug-in sensor plugged into an electrical outlet of the electrical circuit of the location. As the load is applied, the voltage drop at the electrical outlet may be measured and utilized to estimate the resistance ("$R_L$") on the line wire of the service drop and the resistance ("$R_N$") on the neutral wire of the service drop between the service panel of the location and the transformer that provides power to the location.

A machine learning ("ML") model, such as a convolutional neural network ("CNN"), may also be trained to estimate appliance current based on the voltage signal measured at the electrical outlet and the estimated resistance on the line wire of the service drop between the service panel of the location and the transformer that provides power to the location. In some implementations, a different ML model may be trained to determine appliance current based on the inputs of voltage measurements and estimated resistance on the service drop. In such an example, the inputs may be provided to each of the ML models and appliance energy consumption determined based on the outputs of each ML model. In other implementations, a single ML model may be trained to determine appliance current for multiple appliances. In such an example, the trained ML model may output appliance currents determined for each appliance for which it is trained.

Based on the appliance current determinations, determined in accordance with the disclosed implementations, recommendations may be made as to when appliances should be operated to reduce the cost of energy usage, to identify appliances operating the location, to identify appliances that are not operating efficiently, etc. In some implementations, appliance operation times may be automatically adjusted such that the appliances operate during lower energy consumption times to reduce the cost to the user and reduce the overall consumption of energy. For example, it may be determined that operation of a dishwasher, dryer, washing machine, etc., is more cost effective later in the evening or at night. In such an example, an operator, such as a homeowner, may set the appliance to start at a later time. In other implementations, one or more control systems, may automatically control or adjust the start/stop time of appliances based on the cost of energy and the determined energy usage of those appliances.

As discussed herein, the disclosed implementations provide a technical improvement over existing systems as they determine energy estimation of appliances within a location without the need for a professionally installed monitoring system. Still further, the disclosed implementations are able to estimate energy usage of appliances at a location based on voltage measurements, without the need to measure current.

FIG. 1 is a block diagram of a location 100 for which appliance energy usages is estimated, in accordance with disclosed implementations. In this example, the location is a home location that includes a structure 106 in the form of a personal residence. It will be appreciated that the location and corresponding structure may be any location or structure. For example, the location may be residential, business, commercial, public, etc. Likewise, the structure may be a personal residence, apartment, office building, government building, municipal building, entertainment facility (e.g., coliseum, stadium), shopping facility, etc.

One or more plug-in sensors 101 may be positioned at the location 100 by simply plugging in the plug-in sensor into any common electrical outlet of the electrical circuit at the location. In some implementations, multiple plug-in sensors 101 may be utilized, for example, one monitoring each phase of a two-phase power supply at the location. In other implementations, only a single plug-in sensor 101 may be utilized. Additional details about an example plug-in sensor are discussed further below with respect to FIG. 9. Likewise, each location 100 includes one or more appliances 103 that consume variable amounts of energy based on their usage. The appliances 103 may be internal or inside the structure 106, or external or outside the structure 106, and may provide various functions. In some implementations, the appliances 103 may be configured to communicate with a communication component to either receive operation instructions and/or to provide usage information.

As discussed herein, upon installation, the plug-in sensor 101 monitors parameters on the electrical circuit of the location 100. For example, the plug-in sensor 101 may monitor for voltage changes at the location and extract from a baseline voltage for the location, detected voltage changes. For example, a location in the United States may receive 120 volts ("120V") at 60 Hertz ("Hz") frequency, which represents a baseline that is known for the plug-in sensor 101.

As is typical, a transformer 151, such as a split-phase transformer, provides power to the location through a service drop 109 that is connected between the transformer 151 and a service panel 107 of a location. As is known, the transformer 151 is connected to a power grid and provides power to the location 100 through the service drop 109. As is also known, the service panel 107 is a central distribution point for the location 100 and connects the service drop 109 coming from the transformer 151 to exit wires, also known as branch wires, of the electrical circuits of the location 100.

As discussed, voltage measured at the electrical outlet into which the plug-in sensor 101 is inserted may be used to determine a resistance on the service drop 109 between the service panel 107 of the location and the transformer 151 that provides power to the location 100. The plug-in sensor 101 may also measure voltage drop at the electrical outlet into which the plug-in sensor 101 is inserted. The measured voltage drops and the resistance on the service drop 109 may be provided as inputs to one or more ML models and appliance energy estimation for one or more appliances 103 operating at the location 100 may be determined, as discussed further below The system may also include computing resource(s) 121. The computing resource(s) 121 may be remote from the location 100. Likewise, the computing resource(s) 121 may be configured to communicate over a network 102 with the location 100, the plug-in sensor 101, and/or the appliances 103. Likewise, the computing resource(s) 121 may communicate over the network 102 with one or more power systems 150, one or more third party service(s) 131, and/or any number of other locations.

As illustrated, the computing resource(s) 121 may be implemented as one or more servers 121(1), 121(2), . . . , 121(N) and may, in some instances, form a portion of a network-accessible computing platform implemented as a computing infrastructure of processors, storage, software, data access, and so forth that is maintained and accessible by components/devices of the system via a network 102, such as an intranet (e.g., local area network), the Internet, etc. The computing resources 121 may process the determined resistance on the service drop 109 and the measured voltage at the electrical outlet by the plug-in sensor 101, and optionally other data, such as data from third parties 131, data from the power system 150, power meter data, etc., to determine appliances in operation at the location 100 and/or energy consumed by those appliances 103 when operating at the location.

The server system(s) 121 does not require end-user knowledge of the physical location and configuration of the system that delivers the services. Common expressions associated for these remote computing resource(s) 121 include "on-demand computing," "software as a service (SaaS)," "platform computing," "network-accessible platform," "cloud services," "data centers," and so forth. Each of the servers 121(1)-(N) include a processor 117 and memory 119, which may store or otherwise have access to a management system 120, as described herein.

The network 102, and each of the other networks discussed herein, may utilize wired technologies (e.g., wires, USB, fiber optic cable, etc.), wireless technologies (e.g., radio frequency, infrared, NFC, cellular, satellite, Bluetooth, etc.), or other connection technologies. The network 102 is representative of any type of communication network, including data and/or voice network, and may be implemented using wired infrastructure (e.g., cable, CAT6, fiber optic cable, etc.), a wireless infrastructure (e.g., RF, cellular, microwave, satellite, Bluetooth, etc.), and/or other connection technologies.

Figure 2:
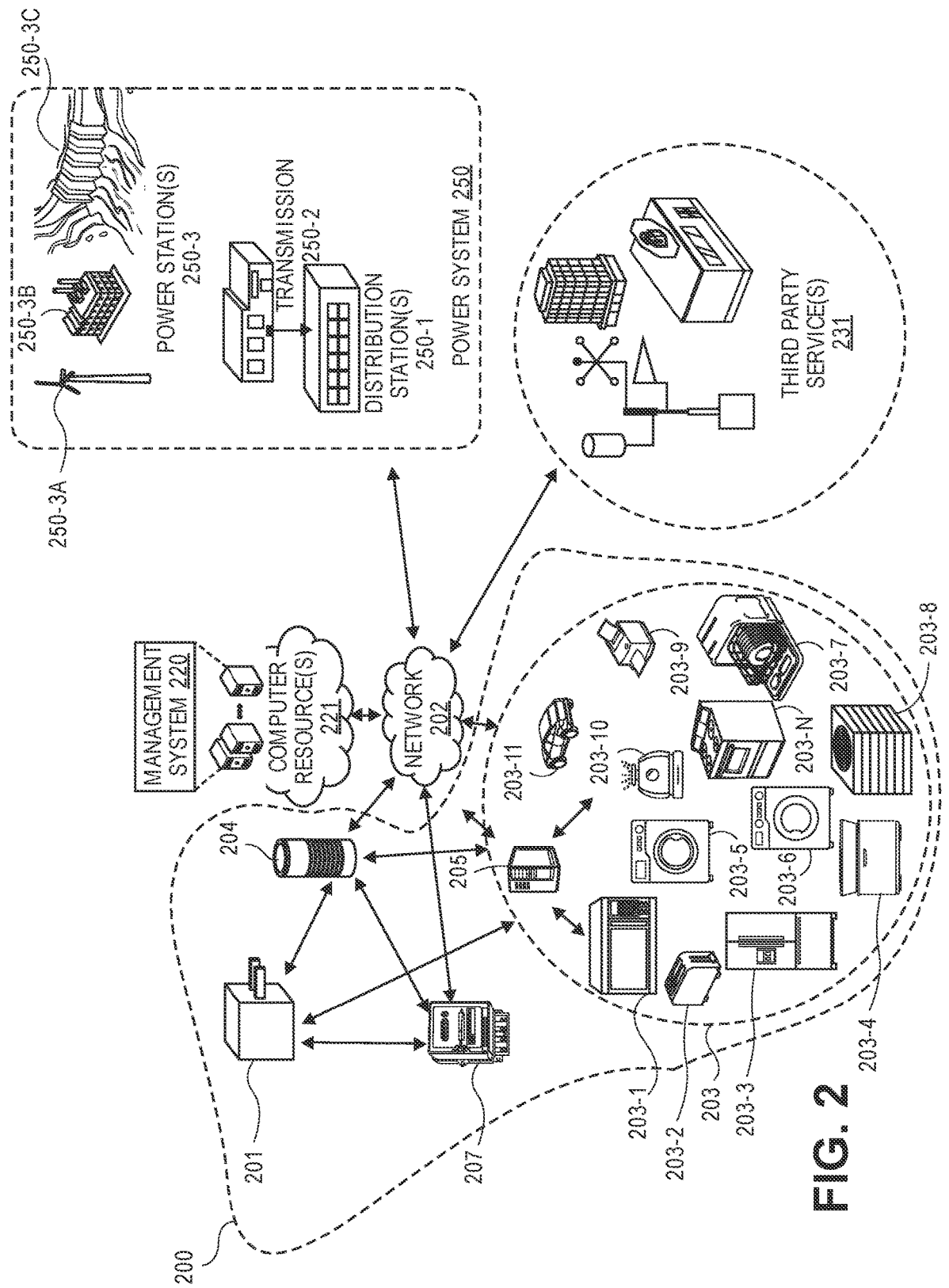
FIG. 2 illustrates a plug-in sensor and appliances of the location illustrated in FIG. 1 and the communication paths with remote systems and services, in accordance with disclosed implementations.

FIG. 2 illustrates additional details of a plug-in sensor 201, appliances 203, third party systems 231, and the power system 250 illustrated in FIG. 1 and the communication paths therebetween, in accordance with disclosed implementations. Example hardware configurations of the plug-in sensor 201 are discussed further below with respect to FIG. 9. In some implementations, the plug-in sensor 201 may be a stand-alone device that may be plugged into any electrical outlet at the location 200 and used to detect appliance operation of any other appliance at the location that is plugged into any other electrical outlet at the location. In other examples, the plug-in sensor 201 may be incorporated into an appliance 203 and/or included as part of a communication component 204.

The plug-in sensor 201 may be powered by the electrical system at the location 200, by battery power, and/or powered from other devices or components. For example, the plug-in sensor 201 may harvest power from the electrical outlet into which it is installed/inserted.

In addition to measuring voltage data at the electrical outlet, the plug-in sensor 201 may be configured to communicate with appliances 203, a power meter 207 at the location 200, and/or a communication component 204 that is also positioned within the location. For example, the plug-in sensor 201 may include a wireless transmitter/receiver that is operable to connect to a wireless network 202 and provide determined voltage data to other appliances 203 and/or the communication component 204 via the wireless network. In other implementations, the plug-in sensor 201 may be configured to transmit data, such as detected voltage data, to other components, such as the communication component 204 via the electrical circuit at the location 200. In some implementations, the plug-in sensor may also be configured to estimate the resistance on the service drop between the service panel of the location and the transformer that provides power to the location and/or to determine energy usage of appliances at the location based on the service drop resistance and the voltage measured at the location. In such implementations, the plug-in sensor 201 may also be configured to provide energy usage determined for one or more appliances at the location.

Any form of wired and/or wireless communication may be utilized to facilitate communication between the appliances 203 and/or sensors 201. For example, any one or more of 802.15.4 (ZIGBEE), 802.11 (WI-FI), 802.16 (WiMAX), BLUETOOTH®, Z-WAVE, near field communication ("NFC"), etc., may be used to communicate between the appliances 203 and one or more sensors 201.

Appliances 203 at a location 200 may include any one or more items that consume energy during operation. Examples of appliances 203 include, but are not limited to microwaves 203-1, toasters 203-2, refrigerators 203-3, freezers 203-4, washing machines 203-5, dryers 203-6, dishwashers 203-7, Heating, Ventilation, and Air Conditioning unit ("HVAC") 203-8, printers 203-9, coffee makers 203-10, electric vehicles 203-11, etc. 203-N. In some implementations, the appliances 203 may be connected appliances capable of receiving instructions, referred to herein as command data, from the management system 220, via a communication hub 205, via the communication component 204, and/or directly. In other implementations, one or more appliances 203 may not be connected and may only be controllable by either a user at the location 200 and/or by controlling the electrical circuit that provides power to the appliance. In some implementations, the disclosed implementations may be limited to only determining energy usage of 240V appliances, such as washing machines 203-5, dryers 203-6, HVACs 203-8, etc.

Connected appliances 203 are configured to receive and execute instructions included in command data sent from the management system 220 operating on a remote computing resource directly, via the communication hub 205 that is positioned at the location 200, and/or via the communication component that is positioned at the location. Likewise, in some implementations, the appliances 203 may be further configured to transmit or send operational information (e.g., energy consumption, errors, etc.) to the management system 220, the plug-in sensor 201, and/or the communication component 204. As connected appliances 203 are controlled (e.g., turned on/off), the signature data generated in response thereto may be collected, labeled with the appliance and/or operational state, and associated with the location profile.

In some implementations, the communication hub 205 may forward signature data received from the plug-in sensor 201 to the management system 220 for processing by the management system 220 and/or forward command data received from the management system 220 to various appliances 203 for execution. In other implementations, some, or all of the processing of the signature data may be performed by the communication hub 205. For example, the communication hub 205 may receive signature data from the plug-in sensor 201 and process the signature data in an effort to determine appliance type and/or appliance operational state of an appliance that generated the signature data. In other implementations, the communication hub 205 may receive voltage data from the plug-in sensor 201, process the data to determine the signature data, and then utilize the signature data to determine the operating appliance and/or the state of the operating appliance. In still other examples, voltage data may be sent to the remote management system 220 and the remote management system may process the voltage data to determine the signature data, appliances, appliance state, etc.

While the described implementation discusses a communication hub 205 and a communication component 204 as distinct components, in some implementations, the operation and functions described herein may be performed entirely by one or both of the communication hub 205 or the communication component 204. Accordingly, the use of the terms communication hub 205 and communication component 204 may, in some implementations, be utilized interchangeably.

Regardless of whether appliance energy usage is determined at the plug-in sensor 201, the communication hub 205, the remote computing system 221, and/or some combination thereof, based on the determined service drop resistance and voltage measurements by the plug-in sensor, appliance energy usage of one or more appliances may be determined. For example, the plug-in sensor 201 and/or the communication hub 205 at the location 200 may maintain, in a memory, one or more ML models that are trained to determine from energy usage of one or more appliances at the location 200. When voltage data is generated by the plug-in sensor 201, the plug-in sensor and/or communication hub 205 may process the voltage data and service drop resistance using the one or more ML models to determine which appliance(s) 203 is/are operating at the location 200 and determine the energy usage of those appliances. The appliance identifier and/or appliance type for the appliance determined to be operating may be transmitted to the communication hub 205 and/or the remote management system 220 as determined by the ML model from the voltage data and service drop resistance. In some implementations, appliance state and/or appliance start time and stop time may also be determined and transmitted. Appliance state may be any state or detectable change in an appliance. An appliance 203 may have two states (on and off) or multiple states. For example, a microwave 203-1 may have multiple states, including, standby, on, activation of the rotatable table, energizing of the magnetron, different power levels, and off.

The ML models used herein to determine energy usage of appliances may be trained using appliance signature data indicative of appliance operation. The appliance signature data may be obtained from any of a variety of sources. For example, appliance manufacturers may provide appliance signature data for appliances and/or appliance states of appliances.

In some implementations, additional information from other appliances 203 at the location 200 may also be utilized by the communication hub 205 and/or the management system 220 to determine the appliance and/or energy usage of the appliance. For example, information received from one or more connected appliances 203 may be used to limit or identify candidate appliances that are known to be operating and/or to remove from consideration appliances that are known to not be operating. Likewise, sensors at the location 200 may be used to assist in appliance determination. For example, a light or motion sensor may provide data indicating whether a person is moving in areas of the location 200 and/or whether lights are on/off within areas of the location. As another example, image data and/or other information, such as appliance identification of an appliance 203 in the possession of a person, may be used to identify a person at the location 200. Such information, referred to herein as supplemental information, may be used to expand or reduce the list of candidate appliances 203 that may be operating and generating the detected signal. In still further examples, power meter data output by a power meter 207 at the location 200 may be used as an input in determining appliance operation and/or energy usage of one or more appliances 203 at the location.

In some implementations, third party systems 231 may also provide data, such as weather data, appliance data, expected energy consumption for appliances, appliance signature data, etc., to the management system 220. Third party systems 231 include any type of system or service that is independent of the location 200 that provides data that may be used by the management system 220 to determine an appliance type and/or operational state of an appliance 203 at the location 200. For example, the third-party system 231 may be an appliance manufacturer that provides expected energy consumption information for appliances 203 and/or signature data for appliances. In such an example, the management system 220 may utilize the expected energy consumption information for an appliance 203 to determine if that specific appliance is operating as expected and/or whether replacement of an existing appliance with a different appliance of the same appliance type will save energy.

The power system 250 may also communicate with the management system 220 and provide, for example, energy consumption information for the location 200, demanded power information, or load on the power system, forecasted power demands, costs per unit of power under different operational constraints, etc. For example, the power system 250 may provide information to the management system 220 indicating which power stations are currently operating, the cost per unit of energy produced, and the current load on the power station, also referred to herein as load value. Alternatively, or in addition thereto, energy consumption for a specific location may be provided by an appliance at the location, such as the power meter 207.

A power system 250 typically includes one or more power station(s) 250-3, transmission station(s) 250-2, and distribution station(s) 250-1. Locations, such as location 200 create demand for power provided by the power system 250 and pay for that power.

Power stations 250-3 may include any form of power generation. For example, a power station 250-3 may be a wind-based power station 250-3A, such as a wind farm, a fossil-fuel based power station 250-3B, a hydroelectric power station 250-3C, a solar power station, a nuclear power station, etc. The power system 250 may include any number and type of power stations 250-3.

Electric-power generated by the power stations 250-3 is bulk transmitted at high-voltages via a series of transmission 250-2 lines and stations from the generating power stations 250-3 to distribution stations 250-1. Transmission 250-2 lines and stations when interconnected with each other create transmission networks, which are often referred to as "power grids." The United States has three major power grids, the Western Interconnection, the Eastern Interconnection and the Electric Reliability Council of Texas (ERCOT) grid, often referred to as the Western Grid, the Eastern Grid and the Texas Grid.

The distribution stations 250-1 are located near the locations 200 that create the demand for the power. The distribution stations 250-1 receive the bulk transmissions, step down the voltage, and distribute the electricity to transformers at end locations 200, such as residential housing, businesses, commercial buildings, etc. The transformers then provide the electricity to the location service panel via a service drop for use by appliances 203 at the location 200.

A few of the major constraints with power systems is that power within the system must run at the same frequency and, with only a few exceptions, electrical energy cannot be stored. As such, power must be generated and supplied in real-time at a rate that matches demand. If the demand for power exceeds supply, additional power stations 250-3 must be activated to fulfill the additional demand, or brownouts or blackouts may be experienced at numerous locations that rely upon that power. The distribution stations 250-1 typically bill the locations for the consumption of energy as a measure of kilowatt-hours (kWh), which is a measure of energy. The rate per kWh generally varies based on the current power demand or load of the power system 250 and/or based on the average or expected power demand on the power system. As the power demand on the power system 250 increases, the cost per unit of energy consumed by each location likewise typically increases.

For ease of discussion, the following notations are used herein:

$U_A$—phase A voltage as observed at the output of a transformer that provides power to a location;

$U_B$—phase B voltage as observed at the output of the transformer that provides power to the location;

$R_L$—resistance of the Line wire of a service drop between the transformer and a service panel of the location;

$R_N$—resistance of the Neutral wire of the service drop between the transformer and a service panel of the location;

$U_{ASP}$—phase A voltage as observed at the input of the service panel at the location;

$U_{BSP}$—phase B voltage as observed at the input of the service panel at the location;

$V$—voltage $U_{ASP}$ or $U_{BSP}$ observed at service panel input to the location;

$R_{CL}$—resistance of the Line wire in the electrical circuit of the location that includes the common electrical outlet into which the plug-in sensor is installed/inserted;

$R_{CN}$—resistance of the Neutral wire in the electrical circuit of the location that includes the common electrical outlet into which the plug-in sensor is installed/inserted;

$R_{SSL}$—resistance of switchable load included in the plug-in sensor;

$U_{LE}$—Line-Earth voltage of the line wire of electrical circuit measured by plug-in sensor;

$U_{NE}$—Neutral-Earth voltage of the line wire of electrical circuit measured by plug-in sensor;

$R_{LA}$—resistance of 120V load on phase A of the line wire of the service drop; and $R_{LAB}$—resistance of 2-phase 240V load.

Figure 3:
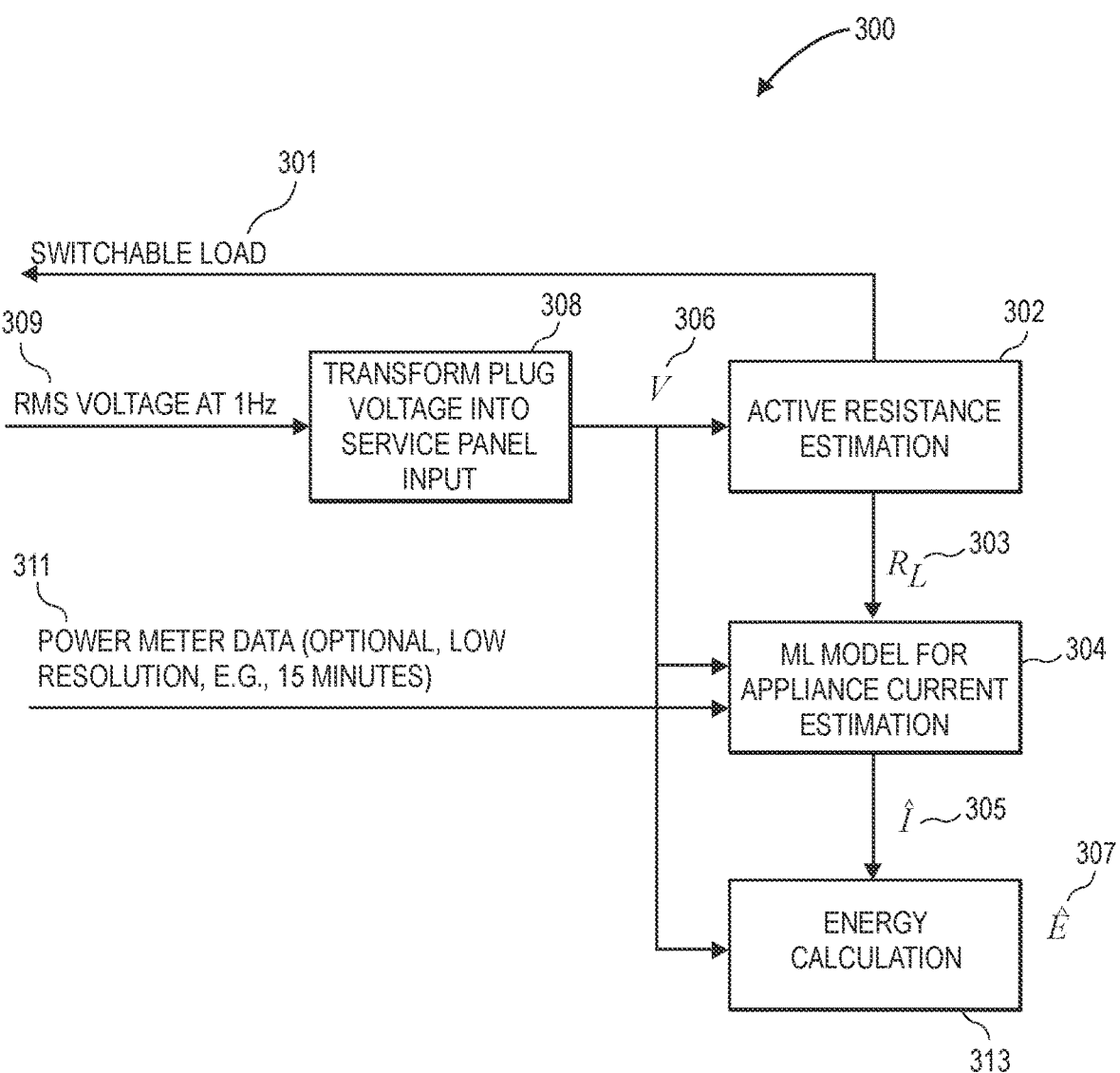
FIG. 3 is a block diagram of the implementations discussed herein for estimating energy consumed by one or more appliances at a location, in accordance with disclosed implementations.

FIG. 3 is a block diagram 300 of the implementations discussed herein for estimating energy consumed by one or more appliances at a location, in accordance with disclosed implementations.

Power (and energy) estimation requires knowledge of the line voltage and current drawn by an appliance. As discussed herein, current drawn by an appliance may be determined based on other measured quantities. As discussed, the current drawn by an appliance is determined based on the voltage drop measured at a common electrical outlet by a plug-in sensor inserted/installed in the electrical outlet that is created by the appliance during operation. This voltage drop measured at the electrical outlet may be used to determine the voltage drop created on the resistance of the service drop between the location and the transformer.

At an overall level, and as discussed further below, output plug voltage measurements of line-earth voltage $U_{LE}$ and neutral-earth $U_{NE}$ measured by a plug-in sensor installed/ inserted into a common electrical outlet of an electrical circuit at location are transformed into phase A service panel input voltage ("$U_{ASP}$") or phase B service panel input voltage ("$U_{BSP}$"). While the following discussion focuses on determining $U_{ASP}$, the disclosed implementations are equally applicable determining $U_{BSP}$.

A line resistance ("$R_L$") of the line wire of the service drop is measured using a switchable load ("$R_{SSL}$") of a plug-in sensor inserted/installed into a common electrical outlet of an electrical circuit of a location. Finally, an appliance (load $R_{LAB}$) current and corresponding energy usage is estimated based on the voltage drop on the line resistance $R_L$.

As discussed further below, active resistance estimation 302 may be performed by a plug-in sensor 101 plugged into an electrical outlet of an electrical circuit at a location. In some implementations, if an appliance is plugged into the plug-in sensor that is plugged into the electrical outlet, a measured current consumed by the appliance plugged into the plug-in sensor can be used in conjunction with voltage measurements on Neutral-Earth and Line-Earth wires of the electrical circuit to estimate the resistance $R_L$ of the line wire of the service drop between the home and the transformer. However, the accuracy of this approach depends heavily on the type of appliance plugged into the plug-in sensor and the appliances cycling pattern. In general, the ideal appliance for resistance estimation has a high power draw and cycles often. However, because the plug-in sensor may often-times be used to control operation of lights that do not cycle often and draw little power, in some implementations, the plug-in sensor may include a resistor or other switchable load 301 that may be switched on and off in short bursts (e.g., for one electrical cycle or -sixteen milliseconds) in a periodic or random and therefore uncorrelated way to create a known current draw by the plug-in sensor 101. By periodically or randomly actuating the switchable load 301 of the plug-in sensor 101 the voltage drop at the electrical outlet can be determined and the root mean square ("RMS") voltage at 1 Hz 309 determined over time. As illustrated by block 308, the RMS voltage 309 measured at the electrical outlet as the load is switched on/off may be transformed into a service panel input voltage ("V") 306 and converge to a resistance of $R_L$ on the line wire of the service drop over time, illustrated in FIG. 3 as $R_L$ 303. V may be the actual service panel input voltage into the service panel or input voltage $U_{ASP}$ or $U_{BSP}$, as determined by the implementations discussed herein. $R_L$ is the actual resistance on the line wire of the service drop or the resistance on the line wire of the service drop as determined by the implementations discussed herein. In some implementations, $R_L$ may be recalculated periodically to account for changes in weather, humidity, etc.

As illustrated at block 304, the service panel input voltage V 306 and the resistance on the service drop $R_L$ 303, and optionally power meter data 311 or other third-part data, may be provided to one or more ML models to determine the current draw $\hat{I}$ 305 of an appliance operating at the location.

As discussed herein, the service panel input voltage V 306 and the resistance on the service drop $R_L$ 303 may be provided to one or more ML models and each of those one or more ML models may generate the estimated current $\hat{I}$ 305 of respective appliances for which those ML models were trained. In other implementations, a single ML model may be trained to generate estimated currents for each of a plurality of appliances based on an input voltage V 306 into the service panel and the resistance on the service drop $R_L$ 303.

Finally, as illustrated by block 313, the current estimation $\hat{I}$ 305 and the determined service panel input voltage V 306 may be used to calculate the energy $\hat{E}$ 307 consumed by the appliance during the measured operation of the appliance.

The following discussion provides additional details for each of the components illustrated and discussed with respect to FIG. 3.

Figure 4:
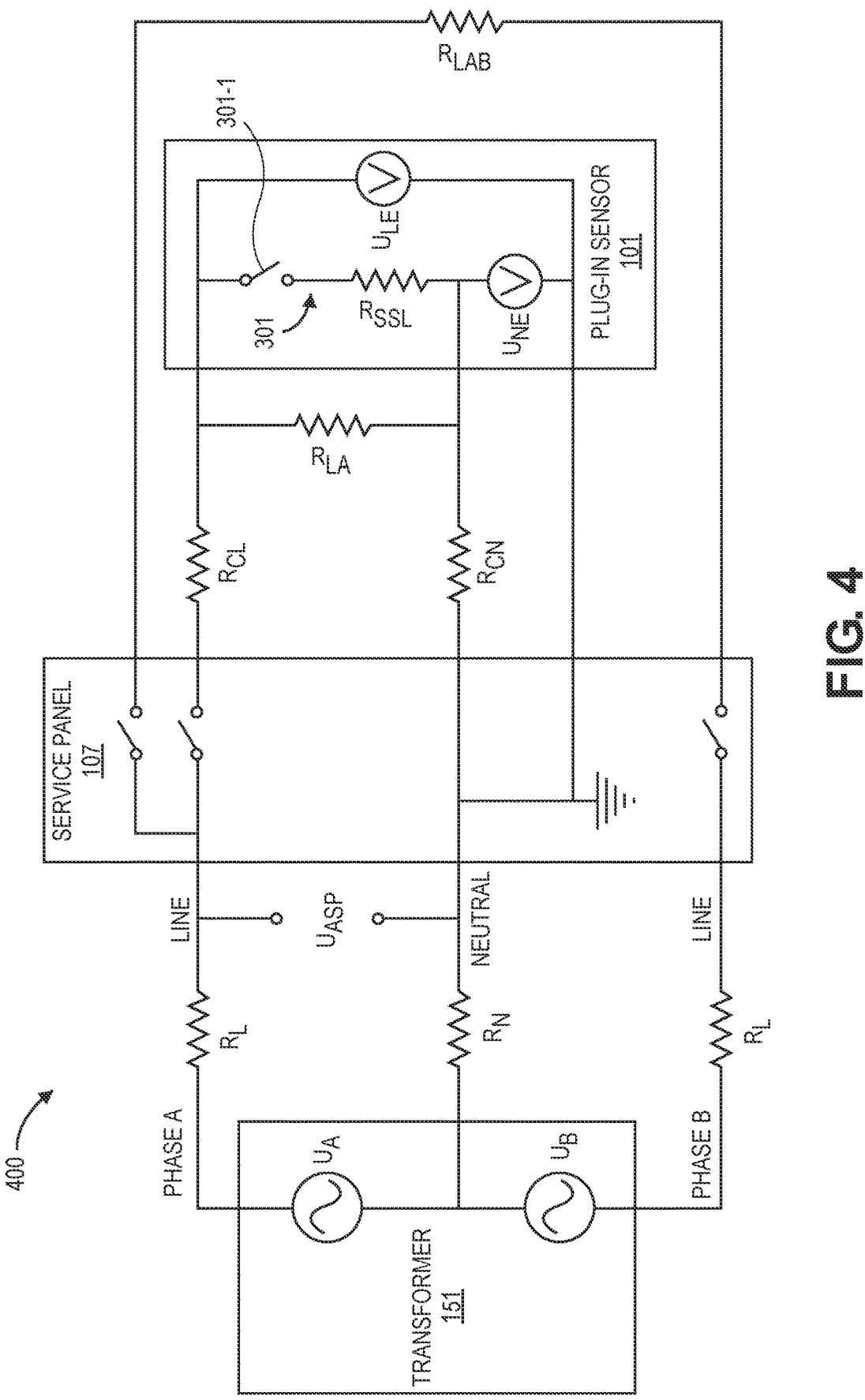
FIG. 4 illustrates an example diagram of an electrical circuit at a location at which a plug-in sensor may be installed and operate to determine operation of an appliance and the energy consumed by the appliance, in accordance with disclosed implementations.

Starting first with FIG. 4, illustrated is an example diagram 400 of an electrical circuit at a location at which a plug-in sensor may be installed and operate to determine operation of an appliance and the energy consumed by the appliance, in accordance with disclosed implementations.

To transform the voltage measured at the electrical outlet by the plug-in sensor, Applying Kirchhoff's voltage law to the circuit 400:

$$U_{ASP} = U_A - U_{R_L} - U_{R_N}$$

$$U_{LE} = U_A - U_{R_L} - U_{R_{CL}} - U_{R_N}$$

$$U_{NE} = U_{R_{CN}}$$

Further, by summing $U_{LE}$ and $U_{NE}$:

$$U_{LE} + U_{NE} = U_A - U_{R_L} - U_{R_{CL}} - U_{R_N} + U_{R_{CN}}$$

With the disclosed implementations, it is assumed that the resistance of the line wire of the circuit at the location and the resistance of the neutral wire of the circuit at the location are equal because the same gauge of wires is typically used in a circuit at a location. Accordingly:

$$U_{R_{CL}} = U_{R_{CN}}$$

By setting the resistance of the line and neutral wires as equal, the sum of $U_{LE}$ and $U_{NE}$ reduces to:

$$U_{LE} + U_{NE} = U_A - U_{R_L} - U_{R_N} = U_{ASP},$$

$$U_{ASP} = U_{LE} + U_{NE}$$

Accordingly, $U_{LE}$ and $U_{NE}$ voltage measurements can be transformed into the input voltage $U_{ASP}$ into the service panel 107 by summing the two measurements $U_{LE}$ and $U_{NE}$.

To estimate line resistance at the line wire of the service drop into the service panel, a load with a known current may be applied by the plug-in sensor 101. For example, the switch 301-1 of the switchable load 301 may be periodically or randomly activated during a period of time a minimum number of times to create a measurable voltage drop on the line resistance at the electrical outlet to which the plug-in sensor 101 is installed. In other implementations, rather than or in addition to applying known switchable load 301 from the plug-in sensor, a current of an appliance connected to the plug-in sensor 101 or the electrical outlet to which the plug-in sensor is connected can be measured, along with a drop in voltage at the electrical outlet when the appliance is switched on/off and/or changes states.

Regardless of whether a known switchable load 301 is applied or measurements are based on an appliance plugged into the plug-in sensor/electrical outlet, line resistance of the line wire of the service drop into the service panel can be estimated based on voltage changes measured at the electrical outlet into which the plug-in sensor is connected, those voltage changes resulting from known current changes through actuation of the known load or the plugged in appliance. For example, if $I_L$ is the RMS of a known current signal, e.g., drawn by $R_{SSL}$ of the switchable load 301 in FIG. 4, the current derivative (i.e., how the current changes over time) can be expressed as:

$$\Delta I_L[n]=I_L[n]-I_L[n-1]$$

where n is the number of samples measured by the plug-in sensor 101. The corresponding voltage changes at the input to the service panel can be written as:

$$\Delta U_{ASP}[n]=U_{ASP}[n]-U_{ASP}[n-1],$$

$$\Delta U_{ASP}[n]\Delta I_L[n]\cdot(R_L+R_N).$$

Similar to the above, assuming the resistance of the line wire ($R_L$) of the service drop is equivalent to the resistance of the neutral wire ($R_N$) of the service drop, the resistance of the line wire can be expressed as:

$$R_L = \frac{\Delta U_{ASP}[n]}{2\Delta I_L[n]}.$$

To improve the estimate of $R_L$, multiple measurements may be taken as the load is periodically or randomly applied to the circuit of the location, which may be expressed as:

$$R_L \triangleq F_R\left(\left|\frac{\Delta U_{ASP}[n]}{2\Delta I_L[n]}\right|\right)_{n=1}^N,$$

where $F_R$ is a function such as mean, median, or learnable Additionally, a threshold can be applied and only current and/or voltage changes that are above a defined value may be selected.

Utilizing the above, current $R_{LAB}$ drawn by an appliance operating on the circuit 400 at the location at which the plug-in sensor 101 is installed can be determined. For example, based on the above, the resistance $R_L$ on the line wire of the service drop into the service panel 107 from the transformer 151 can be determined and the voltage measurements $U_{LE}$ and $U_{NE}$ measured by the plug-in sensor 101 can be transformed into voltage at the input to the service panel 107. If there was no grid noise (e.g., voltage regulation) and the current $R_{LAB}$ drawn by the appliance was the only active load connected to the transformer 151, a change in the load current $\Delta I_{LAB}$ of the appliance could be determined as a ratio of voltage change $\Delta U_{ASP}$ and the line resistance $R_L$ of the line wire of the service drop. However, in real world settings, the voltage drop at line resistance $R_L$, and, as a consequence, voltage $U_{ASP}$, include multiple components produced by all the loads active on the transformer 151, such as unknown loads $R_{LA}$ on the electrical circuit at the location. The voltage is also affected by grid regulation.

Accordingly, in accordance with the disclosed implementations, a function $F_I$ is defined that estimates an appliance's current based on the voltage $U_{ASP}$ and resistance $R_L$ on the line wire of the service drop between the transformer 151 and the service panel 107. The purpose of the function $F_I$ is to extract from $U_{ASP}$ the voltage changes that are caused by an appliance of interest that is operating at the location and connected to the circuit. As discussed further below, the function $F_I$ may be realized by an ML model, such as a CNN.

As discussed above, resistance estimation can be done based on an appliance connected to the plug-in sensor 101 or by actively switching a load 301 of the plug-in sensor 101 and measuring current and voltage drops at the electrical outlet caused by the on/off actuation of the load over a period of time. There is a balance between the time and number of actuations required for the measurements to converge and the load applied with each actuation.

Mathematically speaking, the standard error e in estimating the mean of a statistic $\Delta V$ is a function of the estimators variance $\sigma^2$ (noise caused by, for example, grid effects and appliance activity) and the number of trials or actuations N, i.e., $$\epsilon = \frac{\sigma}{\sqrt{N}}.$$

The relative estimation error is therefore $$E = \frac{\Delta V + \epsilon}{\Delta V} - 1.$$

This error can be minimized by either maximizing $\Delta V$ (causing a large voltage drop), actuating the load often to maximize N, or by minimizing $\sigma$. In one implementation, the noise variance $\sigma^2$ is reduced based on the knowledge that consecutive electrical cycles are highly correlated. For example, while the voltage measured at an electrical outlet in a residence by a plug-in sensor has standard deviation of ~0.7V, the difference between two consecutive cycles of measurements when a load is repeatedly actuated exhibits a variance of just 0.03V.

Because the current drawn by the resistor $R_{SSL}$ of the switchable load 301 of the plug-in sensor 101 is dissipated as heat and additional heat build-up might require increasing the size of the plug-in sensor, in some implementations, the convergence time may be determined based on a fixed power dissipation rate and amperage of the resistor $R_{SSL}$ of the switchable load 301. The following Table 1 illustrates the expected convergence time as a function of the amperage ("Amps.") of the resistor $R_{SSL}$ of the switchable load 301 of the plug-in sensor and the corresponding dissipation rate:

TABLE 1

|  | 0.5 W | 1.0 W | 2.0 W | 4.0 W |
| --- | --- | --- | --- | --- |
| 0.5 Amps. | 810 min. | 405 min. | 203 min. | 101 min. |
| 1.0 Amps. | 405 min. | 203 min. | 101 min. | 51 min. |
| 5.0 Amps. | 81 min. | 41 min. | 20 min. | 10 min. |
| 10 Amps. | 41 min. | 20 min. | 10 min. | 5 min. |
| 20 Amps. | 20 min. | 10 min. | 5 min. | 3 min. |

As illustrated from the above Table 1, a higher amperage of the $R_{SSL}$ of the switchable load 301 leads to shorter convergence times even when keeping the power dissipation rate fixed. However, excessively large current bursts increase the risk of undesired effects in the circuit, such as trips of a breaker switch due to a false positive over-current or arc fault detection. Accordingly, in some implementations, the dissipation rate may be set to 0.5 W and a resistor $R_{SSL}$ drawing 5.0 Amps in order to converge in roughly 81 minutes of actuating the switchable load in short bursts, as discussed above. In other implementations, the dissipation rate, and/or amperages of the resistor, along with the convergence time, may be different. Still further, in some implementations, the procedure for estimating resistance can be paused to prevent heat buildup.

Figure 5:
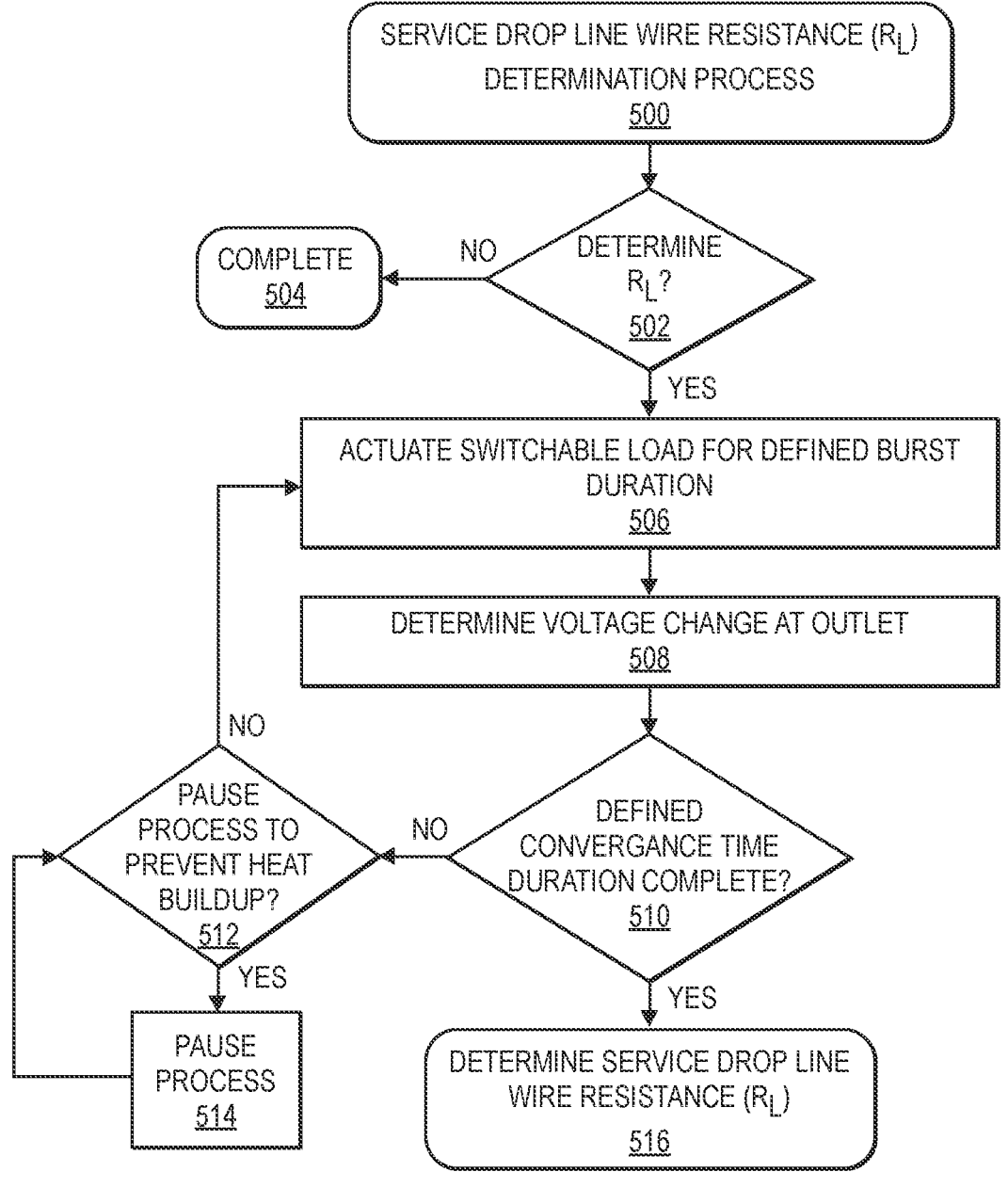
FIG. 5 is an example resistance determination process to estimate a resistance of a line wire of a service drop between a transformer and a service panel of a location, in accordance with disclosed implementations.

FIG. 5 is an example resistance determination process 500 to estimate a resistance of a line wire of a service drop between a transformer and a service panel of a location, in accordance with disclosed implementations.

The example process 500 begins by determining whether the resistance $R_L$ at the line wire of the service drop is to determined, as in 502. In some implementations, each time the plug-in sensor is powered on, for example when plugged into an electrical outlet, it may be determined that the resistance at the line wire of the service drop to the location is to be determined. In other examples, the plug-in sensor may be configured to periodically perform the example process 500 and determine the resistance at the line wire of the service drop. For example, the plug-in sensor may be configured to determine the resistance at the line wire of the service drop weekly, monthly, quarterly, etc. If it is determined that the resistance at the line wire of the service drop is not to be determined, the example process completes, as in 504.

If it is determined that the resistance at the line wire of the service drop into the service panel of the location is to be determined, the switchable load of the plug-in sensor is activated for a defined burst duration, as in 506. As discussed above, the defined burst duration may be any duration that results in a known current being applied to the circuit and a measurable voltage change detectable at the electrical outlet to which the plug-in sensor is installed. In one example, the burst duration is one electrical cycle, or approximately 16 milliseconds. In other implementations, the burst duration may be longer or shorter.

As the switchable load with a known current is applied, the voltage change at the electrical outlet is determined by the plug-in sensor, as in 508. As is known in the art, the voltage change at the electrical outlet may be measured across the line-ground wires or the neutral-ground wires and determined as a difference between the measured voltage at the outlet and a baseline or known voltage when the load is not applied to the electrical circuit.

After determining the voltage change resulting from the applied load, a determination is made as to whether a defined convergence time duration has completed, as in 510. As discussed above, the convergence time may be determined based on the amperage of the switchable load and the dissipation rate. As one example, if the amperage of the switchable load is 5.0 Amps. and the dissipation rate is 0.5 W, the defined convergence time may be set to 81 minutes.

If it is determined that the defined convergence time duration has not completed, a determination may be made as to whether the example process 500 is to be paused to prevent heat buildup at the plug-in sensor, as in 512. For example, a temperature or heat sensor may be included in the plug-in sensor and if the heat sensor exceeds a defined temperature threshold, it may be determined that the example process is to be paused. If it is determined that the example process 500 is to be paused, the process is paused, as in 514, and the process returns to block 512. Once it is determined at decision block 512 that the process should not be paused (or no longer paused), the example process 500 returns to block 506 and continues.

Returning to decision block 510, once it is determined that the defined convergence time duration has completed, the example process completes by determining the resistance $R_L$ at the line wire of the service drop line into the service panel of the location, as in 516. Specifically, the known current of the switchable load of the plug-in sensor and the determined voltage change may be utilized, as discussed above, to determine the resistance $R_L$ at the line wire of the service drop into the service panel of the location.

Figure 6:
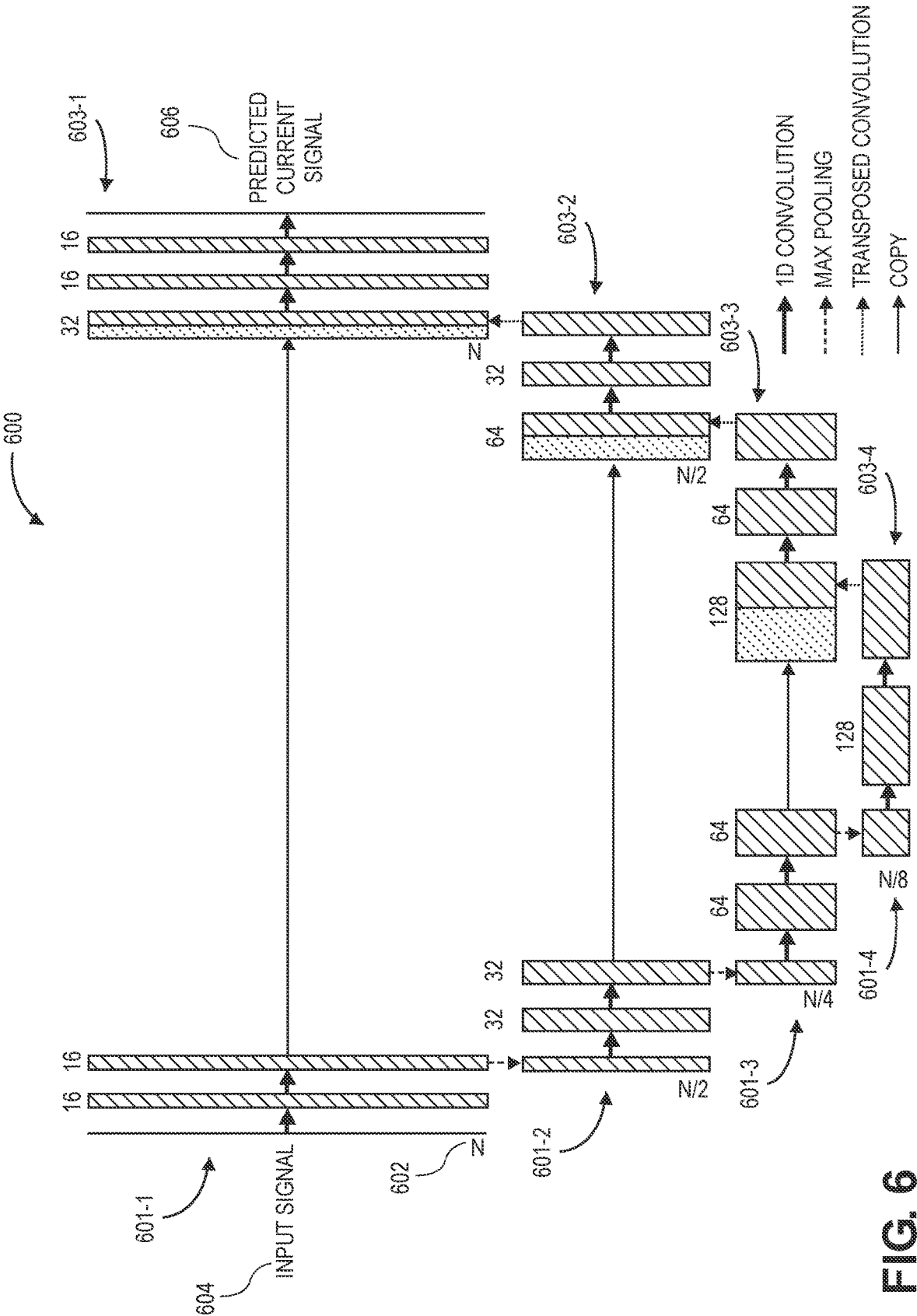
FIG. 6 is an illustration of a machine learning model, in the form of a 1D-UNet neural network, that learns a function $F_I$, in accordance with disclosed implementations.

FIG. 6 is an illustration 600 of an ML model, in the form of a 1D-UNet neural network, that learns a function $F_f$, in accordance with disclosed implementations.

As is known, a 1D-UNet is a fully convolutional neural network model that includes a contraction path, also known as an encoding path or encoder, and an expansion path, also known as a decoding path or decoder. In the example illustrated in FIG. 6, the 1D-UNet includes four encoding stages 601-1, 601-2, 601-3, and 601-4 and four decoding stages 603-1, 603-2, 603-3, and 603-4. In this example, the network has 1D convolution layers in the encoding blocks and 1D transposed convolution in the decoding blocks. The network 600 takes N samples 602 as the input signal 604 and outputs a predicted current signal 606 of the same size (N samples). While the example neural network illustrates four encoding and decoding stages, in other implementations, the number of stages of either or both of the encoding stages and/or the decoding stages may be different. Likewise, other forms of ML models may be utilized and the one discussed with respect to FIG. 6 is an example.

To train the neural network 600, a data set that includes known or measured voltage changes $U_{ASP}$ determined at the input to a service panel and the known or determined current of an operating appliance load that the ML model is trained to predict may be utilized. For example, using a large data set that includes voltage changes $U_{ASP}$ at a service panel in response to a known load of an appliance for which the ML model is being trained to output, an $R_L$ is determined according to Ohm's Law based on the known/given voltage ($U_{ASP}$) and the known/given current I load of the appliance when operating. The ML input signal may then be computed, as discussed above, and labeled with the known current of the appliance for which the ML model is being trained. Such labeled data may then be used to train the ML model. If the ML model is being trained to predict the current of multiple different appliances, the training data may be expanded to include the known current of those other appliances and corresponding input voltage changes into the service panel in response to operation of those appliances.

The neural network 600 input signal 604 may be defined as:

$$I_{IN}[n] = \frac{-(U_{ASP}[n] - U_{ASP}[0])}{R_L}, n = 0, \ldots, N-1.$$

Accordingly, the input signal 604 is the voltage change determined at the input to the service panel $U_{ASP}$ as a difference between the measured voltage and a starting/known/baseline voltage at the input to the service panel, adjusted based on the determined resistance at the line wine of the service drop into the service panel for each of N number of samples.

As discussed above, in some implementations, such as the one illustrated with respect to FIG. 6, the ML model (e.g., 1D-UNet neural network) may be trained based on data for a specific appliance type (e.g., HVAC, electric vehicles) and when an ML input signal is provided to the ML model, the ML model processes the input signal and outputs, based on the input signal, a predicted current signal of the application for which it was trained. Accordingly, if the appliance for which the ML model is trained is not running when the input signal is generated, the output predicted current signal may be zero. In comparison, if the appliance for which the ML model is trained was operating when the input signal is collected, the output predicted current signal is representative of the predicted current of the appliance, as determined from the input signal.

Accordingly, in some implementations, multiple different ML models may be trained, each trained to output a predicted current signal based on an input signal. For example, a first ML model may be trained to output a predicted current signal for an HVAC. A second ML model may be trained to output a predicted current signal for a dryer. A third ML model may be trained to output a predicted current signal for a dishwasher. A fourth ML model may be trained to output a predicted current signal for an air compressor. As will be appreciated, any number of ML models may be trained for any number of appliances. In such a configuration, the input signal provided by a plug-in sensor may be provided to each of the trained ML models and a predicted current signal of the appliance for which each ML model is trained may be received. From the outputs of the ML model(s), it may be determined which appliances are operating within the location during the time the input signal was generated, as well as the energy usage of each of those operating appliances. In other implementations, one or more multiple output models may be trained to process an input signal and output different predicted current signals, each of the different predicted current signals indicative of the current of an appliance for which the ML model was trained.

Figure 7:
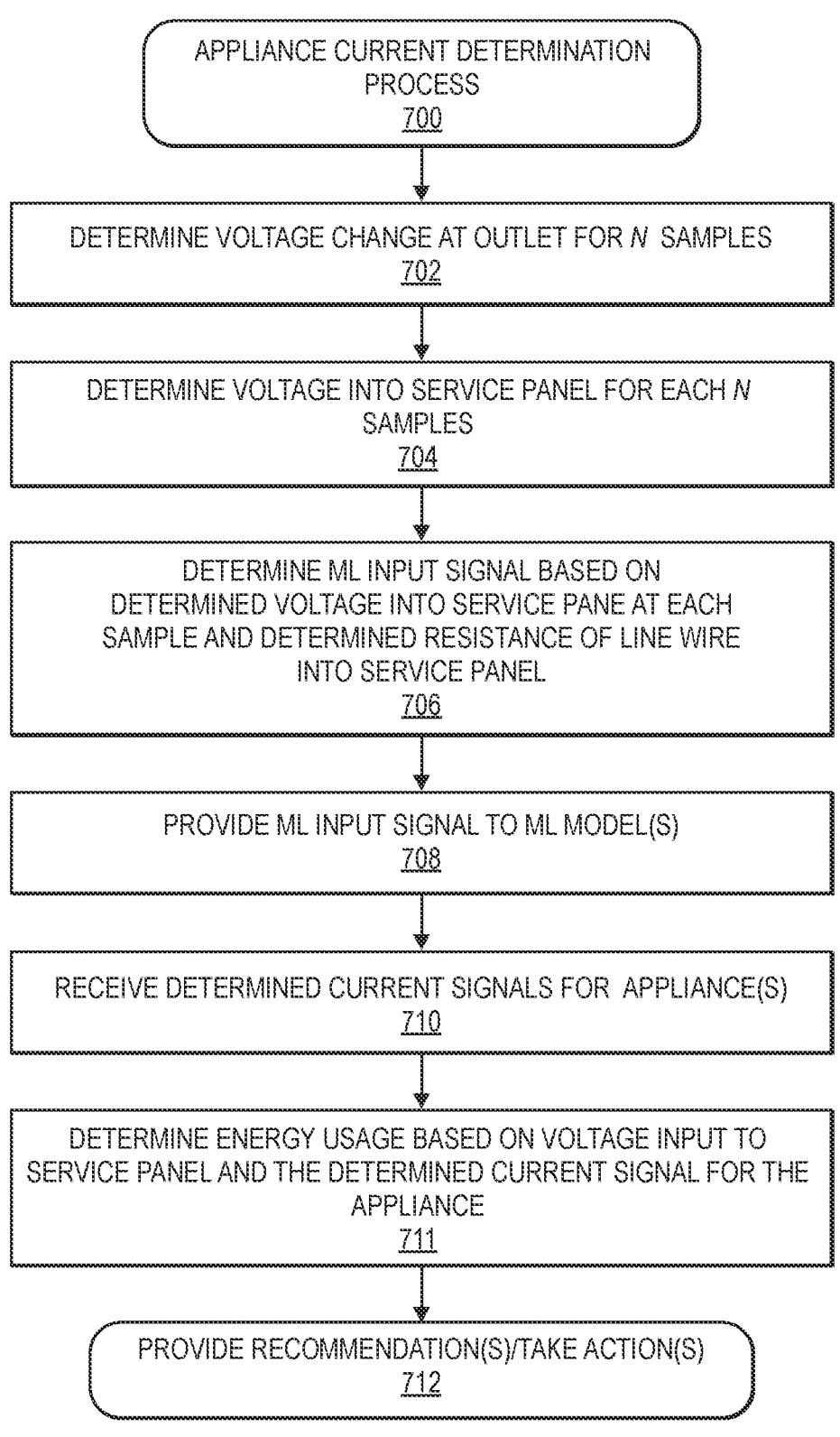
FIG. 7 is an example appliance current determination process in accordance with disclosed implementations.

FIG. 7 is an example appliance current determination process 700 in accordance with disclosed implementations.

The example process begins by determining the change in voltage at a common electrical outlet of an electrical circuit at a location using a plug-in sensor installed/inserted into the electrical outlet for N number of samples, as in 702. As discussed above, for each sample, a difference between the measured voltage at the electrical outlet and a known or baseline voltage at the electrical outlet may be determined as the change in voltage at the electrical outlet for the sample.

The duration of each sample may be of any determined length. For example, the sample duration may be approximately sixteen milliseconds. In other implementations, the sample duration may be longer or shorter. Likewise, any number (N) of samples may be generated. In some implementations, samples may be continuously or periodically generated and processed on a rolling window for a defined duration (e.g., thirty minutes). In other implementations, sampling and the example process may only be performed when changes in the voltage measured at the electrical outlet are detected.

Based on the voltage measured by the plug-in sensor for the electrical outlet in the circuit, the voltage input to the service panel is determined for each sample, as in 704. As discussed above, the voltage ($U_{ASP}$) into the service panel of the location can be computed as the sum of the voltage $U_{LE}$ on the line wire of the circuit as measured at the electrical outlet and the voltage $U_{NE}$ of the neutral wire of the circuit as measured at the electrical outlet.

An ML input signal $I_{IN}$, also referred to herein generally as an input signal, may then be determined based on the determined voltage $U_{ASP}$ into the service panel of the location for each sample and the determined resistance $R_L$ of the line wire of the service drop into the service panel, as in 706. For example, as discussed above, the ML input signal $I_{IN}$ for each sample may be the difference between the voltage into the service panel determined for the sample minus a baseline or initial input voltage determined for the input to the service panel, divided by the resistance at the line wire of the service drop into the service panel, as illustrated by the equation:

$$I_{IN}[n] = \frac{-(U_{ASP}[n] - U_{ASP}[0])}{R_L}, n = 0, \ldots, N-1.$$

The determined ML input signal may then be provided to one or more ML models that are trained to receive ML input signals and determine, based on the received ML input signal, a predicted current of an appliance as represented by the ML input signal, as in 708. After providing the ML input signal, a determined current for the appliance(s) for which the ML model(s) is trained is received, as in 710. Energy used by the appliance, and the cost of the energy usage, may then be determined based on the determined voltage input to the service panel and the determined current signal for the appliance that is output by the ML model, as in 711. For example, the energy ("E") consumed during the period of time may be computed as E=V*I*t, where I is the current output by the ML model and t is the time duration of the current. Still further, the cost of the consumed energy may be calculated based at least in part of cost data provided by a power system, as discussed above.

Finally, one or more recommendations and/or actions may be performed based on the received current of appliance(s) determined to be operating at the location, based on the energy consumed by the appliance, and/or based on the determined cost of the energy consumed by the appliance, as in 712. For example, the received predicted current of one or more appliances at the location may be received by a communication component and a cost estimate determined that indicates the cost to operate the appliance at the current time versus a cost to operate the appliance at a different time. If there is a lower cost time during which the appliance can be operated, a recommendation may be generated and sent to a user, such as a homeowner, recommending that the appliance be operated at a different time, thereby saving the user money. In another example, instructions may be automatically sent to the appliance instructing the appliance to operate at a different time. In still other examples, the action may be to determine appliances operating at the home and when, such as operation of an HVAC, dryer, washer, charging of an electric vehicle, etc. Likewise, the determined current signals and/or energy usage may be utilized to determine if one or more appliances at the location are possibly malfunctioning and a notification (action) sent to user. As another example, appliance energy usage for a location may be utilized to determine possible energy savings programs, grants, virtual power plant ("VPP") program, etc., that may be available or beneficial to the location and such opportunities recommended to a user or automatically initiated.

As still other examples, appliance operation of one or more multiple locations (e.g., neighborhood) may be aggregated and provided to third parties, such as power companies, so that power requirements for the locations can be planned accordingly, thereby potentially avoiding or decreasing brownouts or blackouts during high energy usage.

Figure 8:
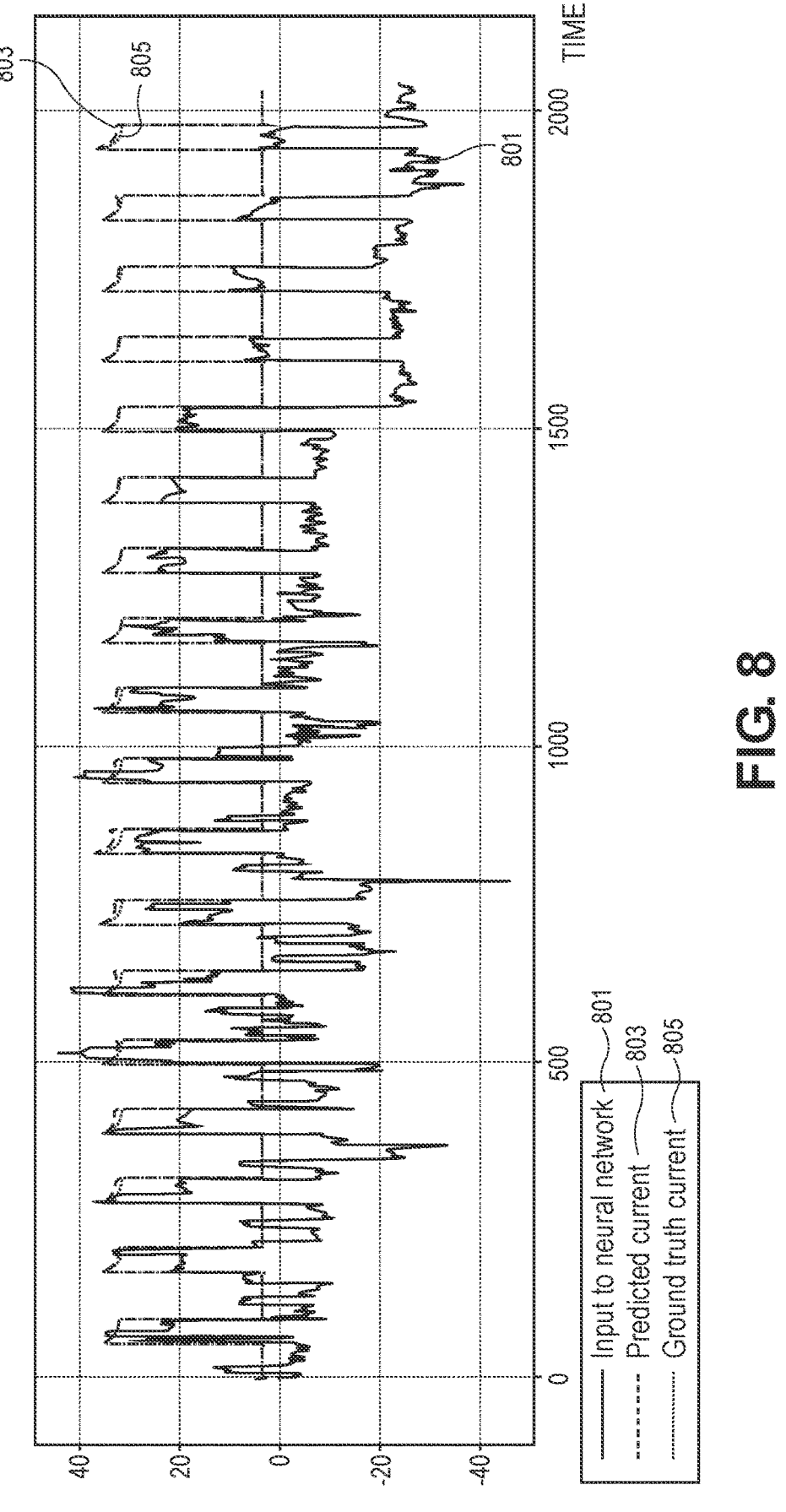
FIG. 8 is an illustration of a predicted clothes dryer current output by a Machine Learning model based on an input voltage signal measured by a plug-in sensor plugged into a common electrical outlet of an electrical circuit, in accordance with disclosed implementations.

FIG. 8 is an illustration of a determined clothes dryer current 803 output by an ML model based on an input voltage signal 801 measured by a plug-in sensor plugged into a common electrical outlet of an electrical circuit, in accordance with disclosed implementations.

As illustrated, the input to the neural network 801 is a voltage signal measured by a plug-in sensor over 2,000 seconds. With the disclosed implementations, as illustrated, the output predicted current 803 from the ML model in response to the input signal 801 is highly correlated with the ground truth 805 or actual current of the clothes dryer.

Figure 9:
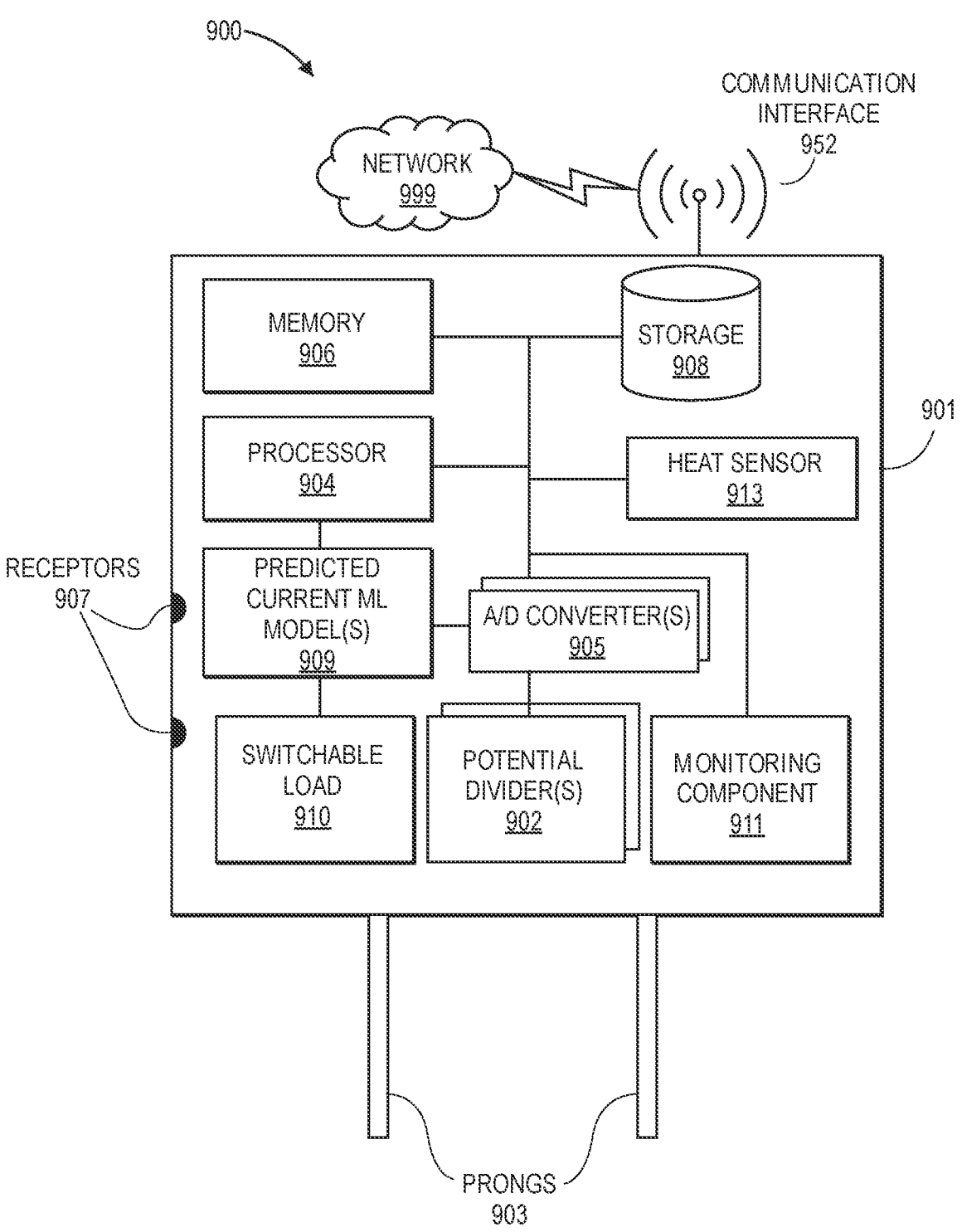
FIG. 9 illustrates example components of a plug-in sensor, in accordance with disclosed implementations.

FIG. 9 illustrates example components of a plug-in sensor 900, in accordance with disclosed implementations.

In some implementations, the plug-in sensor 900 is configured to be installed/inserted into an electrical outlet to interact with an electrical circuit at the location. As such, the plug-in sensor may include an insulating housing 901, such as a plastic body or shell. In some implementations, the housing 901 will be in the form of a cube such that the plug-in sensor has an appearance of a charger or other common electrical component. Protruding from the housing is at least one prong 903. In most instances, as illustrated in FIG. 9, there are two prongs 903 extending from the housing 901. In some implementations, there may be a third prong, or ground (earth) prong. The prongs 903 interface with the electrical circuit at the location and enable the plug-in sensor to be inserted into an electrical outlet at the location, to monitor voltage at the location, transmit information, and/or introduce loads into the circuit at the location. For example, the prongs 903 may be inserted into a common electrical outlet at the location.

Coupled to the prongs 903 are one or more potential dividers 902, such as voltage dividers. In some implementations there are three potential dividers, one for voltage measured from the lead line, one for voltage measured from the neutral line, and one for voltage measured from the earth line. In other implementations, there may be additional or fewer potential dividers 902. The potential dividers 902 convert a high voltage, such as 120 volts, of the electrical circuit at the location into a lower voltage that can be recorded and analyzed at high frequencies (e.g., 200 kilohertz).

The one or more potential dividers may be coupled to one or more analog-to-digital converters 905. The analog-to-digital converters receive the high frequency sampling produced by the one or more potential dividers 902 and convert the analog signal to digital data, referred to herein as voltage data. The voltage data, resistance voltage determined for the line wire of the service drop, voltages determined as inputs to the service panel, etc., may be stored to memory, such as a random-access memory ("RAM"), flash memory, or other forms of permanent or temporary storage 908. Any form of memory may be used with the disclosed implementations.

The prongs 903 may also be coupled to a switchable load introduction component 910, one or more predicted current ML models 909, a monitoring component 911, and/or a heat sensor 913. The switchable load introduction component 910 may be operable to introduce one or more loads into the electrical circuit to which the plug-in sensor 900 is coupled. For example, the switchable load introduction component 910 may be operable to introduce a load of a known current in periodic or random bursts into the electrical circuit through the prongs 903 of the plug-in sensor 900. The monitoring component 911 may be configured to monitor voltage patterns on the electrical circuit, etc. The heat sensor 913 may be operable to measure a heat or temperature of the plug-in sensor 900 which, as discussed above, may be used to pause one or more processes so that heat does not build up in the plug-in sensor 900.

The monitoring component 911 may include components that are configured to measure voltage signals between the lead and earth line, the neutral and earth line, and/or the lead and neutral line. The voltage patterns in the different lines (lead, neutral, earth) may be monitored simultaneously by different components of the monitoring component 911. Likewise, the monitoring component 911 may be in communication with the processor 904, the memory 906, the heat sensor 913, and/or the predicted current ML models 909, and/or the communication interface 952. In some implementations, the monitoring component 911 may perform one or more of the processes or implementations discussed herein.

The memory 906 stores program instructions that are executable by the one or more processors 904 to cause the one or more processors to perform any one or more portions of the implementations discussed herein. For example, the memory 906 may store one or more ML models, determine voltage into the service panel based on measured voltages at the electrical outlet, determine resistance at the line wire of the service drop, determine the input signal that is provided to the trained ML models, and/or determine recommendations or actions based on determined current signals returned from the ML model(s).

The plug-in sensor 900 may also include a communication interface 952, such as a wireless antenna, which enables the plug-in sensor 900 to connect to one or more wireless networks 999, such as a Wi-Fi network, Bluetooth® network, etc., and transmit or receive information, such as measured voltage at the electrical outlet, determined resistance at the line wire of the service drop, voltage input to the service panel, ML input signals, ML output determined current of an appliance, etc.

In some implementations, the plug-in sensor 900 may also include a pair of electrical prong receptors 907 that are configured to receive electrical prongs of another appliance and allow alternating current to passthrough so that the electrical outlet may be utilized by another appliance, in addition to the plug-in sensor 900. In still other implementations, the components of the plug-in sensor 900 may be incorporated entirely into another appliance, such as a communication component, a communication hub, a device, an electrical outlet, etc.

Figure 10:
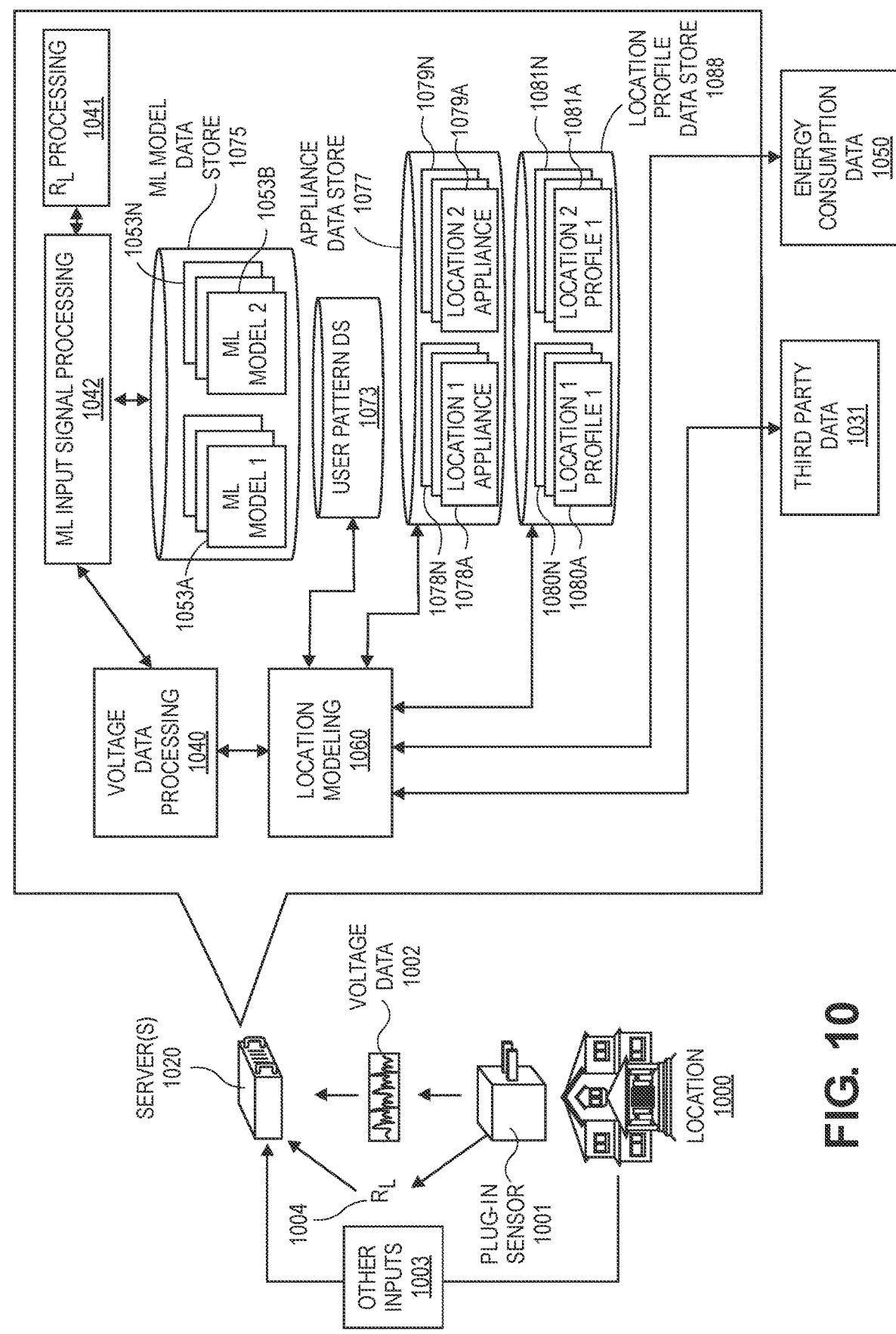
FIG. 10 illustrates example components of a management system, in accordance with disclosed implementations.

FIG. 10 is a conceptual diagram of a server 1020 that processes voltage data/ML Model input signals 1002 and/or other inputs 1003 received from plug-in sensors 1001 at various locations 1000 and optionally receives third party data 1031 from third parties. The various components of the server 1020 may be located on the same or different physical devices. Communication between various components illustrated in FIG. 10 may occur directly or across a network. In operation, the server 1020 may include computer-readable and computer-executable instructions that reside on the server 1020 and perform one or more of the described features or functions, also referred to herein as a management system.

In one implementation, voltage data 1002 measured at an electrical outlet by the plug-in sensor 1001, or voltage data into the service panel of the location 1000 at which the plug-in sensor is installed, as determined by the plug-in sensor, may be transmitted in real time, near real time, or periodically to one or more remote computing resources, illustrated in this example as a server 1020. In other examples, the plug-in sensor 1001 may determine the ML input signal, as discussed above, and provide the ML input signal instead of or in addition to the voltage data 1002. Likewise, the plug-in sensor 1001 may also periodically send a determined resistance $R_L$ 1004 at the line wire of the service drop into the service panel of the location or the measured voltage data that may be utilized by the server(s) 1020 to determine the resistance $R_L$ 1004.

The server(s) 1020 receives and processes the voltage data 1002 and/or the resistance $R_L$ 1004 with voltage data processing 1040 and $R_L$ processing 1041, respectively. Processing voltage data 1002 may include processing the voltage data measured at the electrical outlet by the plug-in sensor 1001 to determine voltage data into the service panel at the electrical outlet and/or to determine resistance at the line wire of the service drop into the service panel, to determine an ML input signal, etc. The voltage at the input to the service panel determined from voltage data processing 1040 and the resistance at the line wire of the service drop into the service panel, as determined by $R_L$ processing 1041, may then be further processed by ML input processing 1042 to generate an input signal that is provided to one or more ML models so that a current of one or more appliances at the location can be determined.

The ML models for different appliance types maintained in the ML model data store 1075 may be expanded as new appliances are created or detected. As discussed, the ML models may be used to process ML model input signals and output determined current signals for the appliance for which the model was trained.

As voltage data 1002 is collected and appliance currents are determined by the ML model(s) 1053A through 1053N, the information, including the appliance and/or appliance type that is operating at the location, the times of operation, the current pattern determined for the operating appliance (s), etc., may be aggregated with other signature data generated by other appliances at the location 1000 to develop a location profile 1080, that is stored in a location profile data store 1088, using a location modeling component 1060. The location profile 1080 may include appliance identifiers and/or appliance data for appliances and/or appliance states of appliances known or determined to be at the location 1000, any operational relationships between appliances and/or appliance states, current data of those appliances, predicted times when those appliances will be operating, an overall location signature data, etc. In addition, in some implementations, the location profile 1080 may also maintain expected and/or actual energy consumption information for detected appliances. For example, received third party data 1031 may include expected energy consumption information for different appliance models. The location modeling component 1060 may also receive energy consumption data 1050 and utilize that information to determine actual energy consumption for appliances at the location.

As location profiles 1080 are developed for different locations, those profiles may be stored in a location profile data store 1088. In some implementations, different location profiles may be generated for a location based on, for example, the day of the week, the number of people at the location, etc. Over time, multiple location profiles may be created for each location and maintained in the location profile data store 1088. For example, location 1 may include multiple location profiles 1080A-1080N generated at different points in time for that location. Likewise, location 2 may include multiple location profiles 1081A-1081N generated at different points in time for that location. Every location may include one or more location profiles that are stored in the location profile data store 1088. The location profiles 1080, which may be associated with different periods of time during the year, may be used to predict appliance operation and times during which appliances are in high demand/high use or low demand/low use. Likewise, each location profile 1080 may have a corresponding embedding vector generated based on current data determined for appliances during the period of time corresponding to the location profile.

In some implementations, voltage data and/or determined current signals 1002 may likewise be used to determine user profiles and/or usage patterns corresponding to the location 1000. For example, determined current signals and/or voltage data 1002 may be used to determine the presence or absence of users at the location 1000 and/or at particular areas within the location. As users typically follow a patterned behavior, over time, the data may be used to determine those user patterns and such information may be stored in the user pattern data store 1073. For example, determined current data from appliance operation of appliances at the location 1000 may be aggregated over a period of time (e.g., thirty days) to determine that on Monday, Tuesday, Wednesday, Thursday, and Friday, a user at the location generally enters the kitchen within the structure between 05:00 hours and 05:30 hours, moves to a second room between 06:30 hours and 07:30 hours and then departs the location until approximately 18:00 hours. Such information may be maintained in the user profile 1080 for the user.

In some implementations, an appliance data store 1077 may also be maintained. The appliance data store 1077 may include information regarding appliances at each location 1000. For example, the appliance data store 1077 may maintain appliance information 1078A-1078N for each of multiple different appliances at a first location, maintain appliance information 1079A-1079N for each of multiple different appliances at a second location, etc.

Appliance information may include, among other information, current signals determined during operation of the appliance, the manufacturer of the appliance, the make, model, and year of manufacture, the power rating of the appliance, the efficiency of the appliance, etc. In some implementations, data received from a same type of appliance operating at different locations may be compared to determine consistency among appliances and/or to detect potential appliance problems or abnormalities. For example, if there are fifty HVACS of Brand A and forty-nine of them have similar current signals but the fiftieth one consumes more current and/or has a different current signal, it may be determined that the fiftieth HVAC is potentially malfunctioning.

Figure 11:
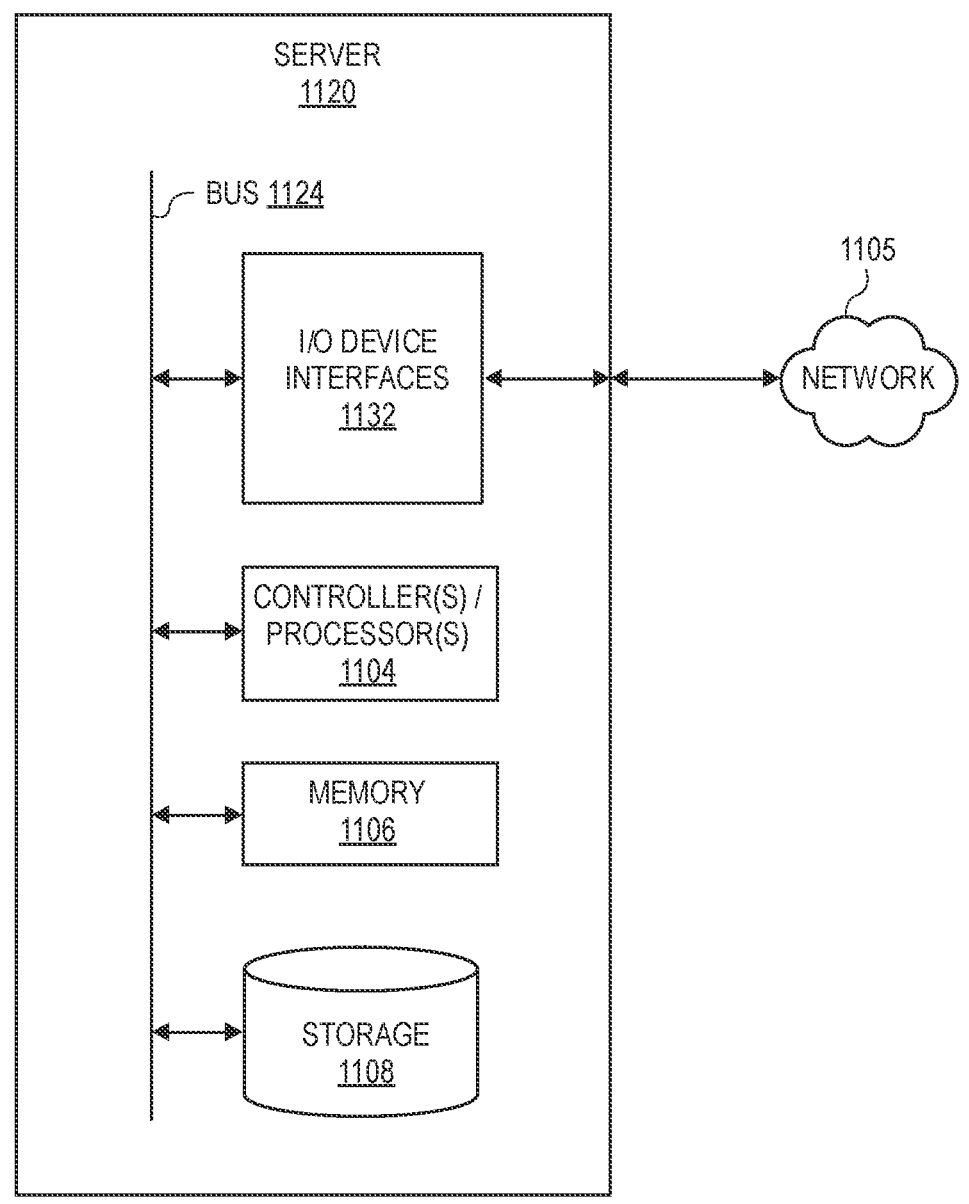
FIG. 11 illustrates example components of a server, in accordance with disclosed implementations.

FIG. 11 is a block diagram conceptually illustrating example components of a remote device, such as a remote server 1120 that may assist with one or more aspects of the disclosed implementations. In operation, the server 1120 may include computer-readable and computer-executable instructions that reside on the server 1120, as will be discussed further below.

The server 1120 may include one or more controllers/processors 1104, that may include a central processing unit (CPU) for processing data and computer-readable instructions, and a memory 1106 for storing data and instructions of the respective device. The memories 1106 may individually include volatile random-access memory (RAM), non-volatile read only memory (ROM), non-volatile magnetoresistive random-access memory (MRAM) and/or other types of memory. The server 1120 may also include a data storage component 1108, for storing data and controller/processor-executable instructions. The data storage component 1108 may include one or more non-volatile storage types such as magnetic storage, optical storage, solid-state storage, etc. The server 1120 may also be connected to removable or external non-volatile memory and/or storage (such as a removable memory card, memory key drive, networked storage, etc.) through an input/output device interface 1132.

Computer instructions for operating the server 1120 and its various components may be executed by the controller (s)/processor(s) 1104, using the memory 1106 as temporary "working" storage at runtime. The server's 1120 computer instructions may be stored in a non-transitory manner in non-volatile memory 1106, storage 1108, or an external device(s). Alternatively, some or all of the executable instructions may be embedded in hardware or firmware on the respective device in addition to, or instead of software.

The server 1120 may also include input/output device interfaces 1132. A variety of components may be connected through the input/output device interfaces. Additionally, the server 1120 may include an address/data bus 1124 for conveying data among components of the server 1120. Each component within the server 1120 may also be directly connected to other components in addition to (or instead of) being connected to other components across the bus 1124.

The server 1120 may wirelessly communicate with and receive signature data and/or voltage data from locations and/or provide instructions to appliances and/or other devices within the location and/or receive data from the appliances/devices. Any form of wired and/or wireless communication may be utilized to facilitate communication between the server 1120, plug-in sensors, communication hubs, communication components, and/or appliances/devices. For example, any one or more of 802.15.4 (ZIGBEE), 802.11 (WI-FI), 802.16 (WiMAX), BLUETOOTH®, Z-WAVE, near field communication ("NFC"), etc., may be used to communicate between the server 1120, the network 1105, and one or more plug-in sensors, communication components, communication hubs, and/or appliances/devices.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers, communications, energy management, and speech processing should recognize that components and process steps described herein may be interchangeable with other components or steps, or combinations of components or steps, and still achieve the benefits and advantages of the present disclosure. Moreover, it should be apparent to one skilled in the art that the disclosure may be practiced without some, or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage media may be implemented by a volatile computer memory, non-volatile computer memory, hard drive, solid-state memory, flash drive, removable disk and/or other media. In addition, components of one or more of the components and engines may be implemented in firmware or hardware.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. A computing system, comprising:
one or more processors; and
a memory storing program instructions that, when executed by the one or more processors, cause the one or more processors to at least:
introduce, a plurality of times and with a device inserted into an electrical outlet of an electrical circuit at a location, a load of a known current into the electrical circuit;
measure, with the device, a first plurality of voltages at the electrical outlet in response to each introduction of the plurality of introductions of the load;
determine, based at least in part on the first plurality of voltages, a resistance on a line wire of a service drop that connects a service panel of the location to a transformer that provides power to the location, wherein the service drop includes at least the line wire;
measure, with the device and during a sample window, a second plurality of voltages at the electrical outlet;
determine, based at least in part on the second plurality of voltages, a plurality of input voltages into the service panel;
generate, based at least in part on the plurality of input voltages and the resistance on the line wire, a machine learning ("ML") input signal;
provide the ML input signal to an ML model trained to receive the ML input signal and generate a predicted current signal indicative of an appliance operating at the location during at least a portion of a period of time;
receive from the trained ML model, the predicted current signal indicative of the appliance operating at the location during at least the portion of the period of time; and
perform at least one action in response to the predicted current signal.

2. The computing system of claim 1, wherein the program instructions that cause the one or more processors to determine the resistance on the line wire, further include instructions that, when executed by the one or more processors, further cause the one or more processors to at least:
determine the resistance on the line wire based at least in part on the known current of the load and a change in voltage measured at the electrical outlet.

3. The computing system of claim 1, wherein the program instructions that cause the one or more processors to determine the plurality of input voltage samples, further include instructions that, when executed by the one or more processors, further cause the one or more processors to at least:

determine, based on each of the second plurality of voltages, the plurality input voltages as a sum of a first voltage measured on the line wire of the electrical outlet and a second voltage measured on a neutral wire of the electrical outlet.

4. The computing system of claim 1, wherein the ML model is trained to output a current signal of a two-phase appliance determined based on the ML input signal.

5. The computing system of claim 1, wherein the action is at least one of:

a recommendation to operate an appliance indicated by the predicted current signal at a different time;

cause the appliance to operate at a different time;

provide a recommendation of a service, grant, or program for the location;

provide power consumption data to a third party; or provide a notification that the appliance may be malfunctioning.

6. A method, comprising:

determining, based at least in part on first voltage data measured by a plug-in sensor plugged into an electrical outlet of an electrical circuit at a location, a resistance at a line wire of a service drop between a service panel of the location and a transformer that provides power to the location through the service drop;

determining, based at least in part on second voltage data measured by the plug-in sensor plugged into the electrical outlet, an input voltage to the service panel;

generating based at least in part on the resistance at the line wire of the service drop and the input voltage to the service panel, a machine learning ("ML") input signal for the location;

providing the ML input signal to an ML model trained to generate a current signal of an appliance; and receiving, from the ML model, a current signal indictive of a current of the appliance for which the ML model was trained, the current signal indicating the current of the appliance operating at the location.

7. The method of claim 6, wherein determining the resistance of the line wire further includes:

introducing a known load into the electrical circuit; and measuring the first voltage data in response to the introduction of the known load.

8. The method of claim 7, wherein introducing the known load, further includes:

introducing the known load into the electrical circuit a plurality of times.

9. The method of claim 8, further comprising:

pausing the introduction of the known load to prevent a heat buildup in the plug-in sensor.

10. The method of claim 7, wherein first voltage data includes a change in voltage at the electrical outlet in response to the introduction of the known load.

11. The method of claim 7, wherein the known load is a known current load introduced by the plug-in sensor.

12. The method of claim 6, further comprising:

determining a type of appliance operating at the location.

13. The method of claim 6, wherein determining the input voltage to the service panel, further includes:

measuring, during an operation of the appliance, voltage at the electrical outlet for a number of samples; and determining the input voltage to the service panel at each sample of the number of samples based at least in part on the voltage measured at the electrical outlet during the sample.

14. The method of claim 6, further comprising:

determining, based at least in part on the input voltage to the service panel and the current signal, an energy consumed by appliance.

15. A computer-implemented method, comprising:

determining, based on a first plurality of voltage measurements taken by a plug-in sensor plugged into an electrical outlet of an electrical circuit at a location, a resistance at a line wire of a service drop between a service panel of the location and a transformer that provides power to the location;

determining, based on a second plurality of voltage measurements taken by the plug-in sensor plugged into the electrical outlet, an input voltage into the service panel; and determining, based at least in part on the resistance at the line wire and the input voltage into the service panel, a current signal of an appliance operating at the location.

16. The computer-implemented method of claim 15, wherein determining the resistance at the line wire, further includes:

introducing a known load into the electrical circuit; and measuring the first plurality of voltage measurements in response to the introduction of the known load.

17. The computer-implemented method of claim 15, further comprising:

determining a type of the appliance operating at the location.

18. The computer-implemented method of claim 15, wherein determining the input voltage into the service panel, further includes:

transforming a line voltage measured at the electrical outlet and a neutral voltage measured at the electrical outlet into the input voltage into the service panel.

19. The computer-implemented method of claim 15, wherein determining the current signal, further includes:

determining, based at least in part on the resistance at the line wire and the input voltage a machine learning ("ML") input signal;

providing the ML input signal to one or more ML models; and receiving the current signal of the appliance from at least one of the one or more ML models.

20. The computer-implemented method of claim 15, wherein the second plurality of voltage measurements are indicative of a voltage drop measured by the plug-in sensor at the electrical outlet.

* * * * *